Figure 1:
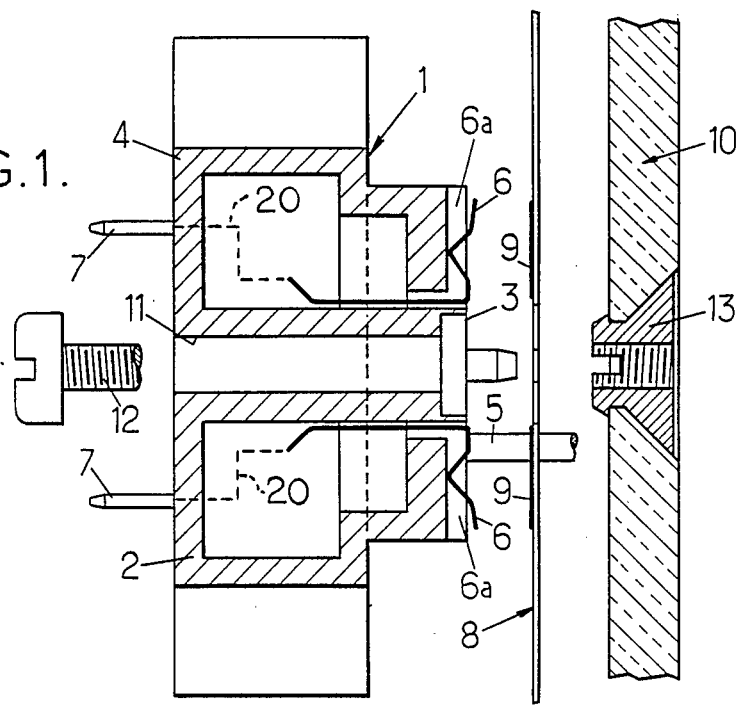

United States Patent [19]

Fournier

[11] Patent Number: 4,931,679
[45] Date of Patent: Jun. 5, 1990

[54] PRINTED CIRCUIT BOARD COMPONENTS WITH ALTERNATE MOUNTING MODES

[75] Inventor: Joel Fournier, Cergy, France

[73] Assignee: Societe D'Applications Generales D'Electricite, Paris, France

[21] Appl. No.: 330,490

[22] Filed: Mar. 30, 1989

[30] Foreign Application Priority Data

Apr. 6, 1988 [FR] France ................. 88 04539

[51] Int. Cl.⁵ .................. H05K 1/00; H01R 27/00
[52] U.S. Cl. .................................... 310/71; 29/839; 29/840; 310/40 MM; 361/405; 439/78; 439/83
[58] Field of Search ........... 29/596, 839; 310/40 MM, 310/71, 89, DIG. 6; 336/192; 361/400, 404, 405, 408; 439/78, 83, 174, 317, 318, 572, 573, 81, 82, 83

[56] References Cited

U.S. PATENT DOCUMENTS

| 3,061,762 | 10/1962 | Schlegel | 439/83 |
| 3,271,627 | 9/1966 | McDougal | 361/408 |
| 4,368,938 | 1/1983 | Mabuchi | 310/71 |
| 4,633,110 | 12/1986 | Genco et al. | 310/71 |
| 4,634,200 | 1/1987 | Dechelette | 439/876 |
| 4,678,250 | 7/1987 | Romine et al. | 439/83 |
| 4,741,703 | 5/1988 | Johnescu et al. | 439/78 |

FOREIGN PATENT DOCUMENTS 138697  4/1985  European Pat. Off. ............ 439/174

Primary Examiner—Patrick R. Salce
Assistant Examiner—D. L. Rebsch
Attorney, Agent, or Firm—Larson and Taylor

[57] ABSTRACT

Electrical component equipped with contacts for its electrical connection with its electrical environment. It is provided with two sets of contacts interconnected electrically by groups of two contacts belonging respectively to these two sets. One of these sets of contacts is constituted by contacts adapted to ensure electrical connections by simple pressure contact on respectively oppositely situated conducting spots, mechanical fastening means being also provided to fix the electrical component mechanically to a support associated with said conducting spots. The other of these sets of contacts is constituted by contacts adapted to be connected mechanically, particularly by welding, to respective conducting members or conducting spots.

5 Claims, 1 Drawing Sheet

U.S. Patent

Jun. 5, 1990

4,931,679

PRINTED CIRCUIT BOARD COMPONENTS WITH ALTERNATE MOUNTING MODES

The present invention relates to an improvement in or to electrical components equipped with contacts for their electrical connection with their electrical environment, in particular for their mechanical and electrical mounting on a printed circuit board. At the present time, electrical components may be mounted on a printed circuit board in one or other of the following ways.

If they are equipped with traversing contacts of the pin type or the like, the component is placed in position on the surface of the board opposite the surface provided with printed circuits and the ends of the contacts passing through corresponding holes of the board, are welded to appropriate conducting spots of the printed circuits. This technique requires multiple bores in the board which must in principal be rigid and can even necessitate metallization (complex and expensive) of all or some of these holes. The welding then ensures the mechanical retention as well as electrical continuities.

Other components are equipped with pressure contacts and are located on the surface of the board provided with printed circuits and the contacts of the component are simply applied elastically against suitable spots of the printed circuits, thus ensuring the elctrical continuities. The mechanical retention may be achieved by welding of the contacts to the corresponding conducting spots or by mechanical fastening (screwing, clipping, stapling, etc.) of the body of the component to the board to maintain the pressure of the contacts on the conducting spots. This method does not necessitate boring and may be employed with printed curcuit supports constituted by flexible and thin films (particularly films of MYLAR).

However electrical components are at present specifically provided for a particular type of mounting, by being equipped with appropriate contacts which prohibit their use in the other type of mounting.

In addition, large electrical components, often presented in a casing, such as transformers, inductances, resistances with incorporated radiators, etc, are fairly often equipped with contacts provided for direct mounting on printed circuits and, when they are, these contacts are of the pin type which prohibit their mounting on unperforated printed circuits.

Finally, other types of components such as electric motors have never been specifically arranged to be mounted directly on a printed circuit board.

It is essentially an object of the invention to provide an arrangement of electrical components which enables the aforesaid drawbacks to be overcome and which permits their mounting both on perforated and unperforated printed circuit boards, so as to extend the field of use of the components without having to multiply the types of manufacturer and so as also to facilitate the mounting of the components (mounting on the surface provided with printed circuits or on the opposite surface) in a crowded environment, these results having to be obtained without notable modification of the structure of the component resulting therefrom and without its cost thereby becoming substantially increased.

To these ends, an electrical component arranged according to the invention is essentially characterized in that it is provided with two sets of contacts interconnected electrically by groups of two contacts belonging respectively to these two sets, one of these sets of contacts being constituted by contacts adapted to ensure electrical connections by simple contact with pressure on conducting spots situated respectively opposite, mechanical fixing means being in addition provided to fix the electrical component mechanically on a support associated with said conducting spots, the other of these sets of contacts being constituted by contacts adapted to be joined mechanically, particularly by welding, to respective conducting members or conducting spots.

By means of this arrangement, the component so equipped may be mounted on a printed circuit board, either by being positioned on the side of the printed circuits, the contacts of the first set of contacts then cooperating by elastic pressure with conducting spots of the printed circuits, or by being positioned on the opposite side to the printed circuits, the contacts of the second set of contacts then passing through the board and being welded to conducting spots of the printed circuits.

Advantageously, the two sets of contacts are arranged respectively on two differnt surfaces or faces, of the component.

In a simple embodiment, the contacts of the first set of contacts are constituted by elastically deformable metal strips. In the same way, the contacts of the second set of contacts are constituted by pins or the like.

Such an arrangement according to the invention is particularly easy to employ when the electrical component is provided with a substantially rigid casing and the contacts of the first and second sets of contacts are supported by this casing.

The arrangement according to the invention finds particularly advantageous use for relatively large elctrical components, such as transformers, inductances, components equipped with integrated radiators, etc., in principle equipped with a casing or boxes, and in addition for electric motors which it then becomes possible to mount directly on a printed circuit board or film.

Figure 2:
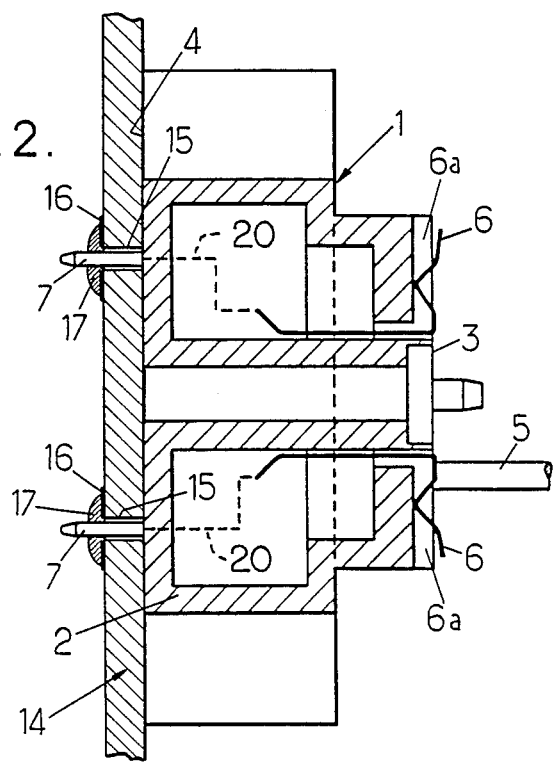

The invention will be better understood on reading the detailed description which follows of a preferred embodiment given purely by way of nonlimiting examples; in this description reference is made to the accompanying drawings in which:

FIG. 1 is an exploded view in cross-section illustrating a first method of mounting an electrical component arranged according to the invention; and FIG. 2 is a view in cross-section illustrating a second method of mounting the electrical component of FIG. 1.

In the example of FIGS. 1 and 2, the electrical component is an electric motor (denoted as a whole by the reference numeral 1) of which only the casing 2 is shown, to simplify the drawings. However it will be understood that the arrangement according to the invention finds application in the same way for other electrical components.

The casing of the motor 1 has two principal faces 3 and 4 and the output shaft of the motor extends substantially perpendicularly to face 3 (in the drawings, the shaft 5 is eccentric, since the casing 2 is assumed to contain also a reducing gear train).

According to the invention, the motor 1 is equipped with two sets of contacts respectively 6 and 7 arranged in the following way: (a) on the surface 3 of the casing appear contacts 6 constituted by elastically deformable metal strips and arranged, for example, each in respective grooves 6a of the casing in order to be held and guided mechanically and insulated electrically from one another; these contacts 6 may have any suitable shape adapted to permit their being urged elastically against a facing support surface and to permit the establishment of electrical continuity with the latter; the sole provision to be respected being that a portion of each contact 6 (its end in the example shown) must project beyond the surface of face 3 of the casing; (b) on the face 4 of the casing are fixed electrical contacts in the form of fingers or pins 7 extending substantially perpendicularly to the surface 4 and of the type currently used for electrical components designed to be fixed and connected electrically by welding on a printed circuit board.

Still according to the invention, the two sets of contacts 6 and 7 are interconnected electrically by groups of two contacts belonging respectively to these two sets; in other words each contact 6 is joined electrically to a contact 7 so that the corresponding electrical connection of the motor may be effected with the electrical environment indifferently through the contact 6 or the contact 7 (these interconnections 20 between the contact 6 and 7 are shown schematically in the drawings).

In FIG. 1 is shown a first embodiment of mounting the motor 1 on a printed circuit board. This board is shown in composite form, that is to say it is constituted by a flexible film 8 (for example of MYLAR), supporting on one of its surfaces printed circuits and in particular conducting spots 9 established in correspondance with the contacts 6. Through its other surface, the film 8 is applied against a rigid support board 10. Of course the method of mounting remains valid for a conventional printed circuit board. The mounting of the motor is effected simply by presenting it before the surface of the film 8 provided with printed circuits, with its contacts 6 opposite conducting spots 9 so that they are elastically urged on to the latter to establish the required electrical connections.

The mechanical fastening of the motor to the board 10 may be performed in any suitable manner compatible with the component (screwing, stapling, clipping, etc.). In the example shown, the motor 1 has an axial passage 11 (central in this case) suitable for receiving a bolt 12 which is screwed into a nut 13 supported in fixed manner by the rigid plate 10. Of course, the film 8 has the necessary gaps for the passage of the bolt 12, and the film 8 and the plate 10 are also pierced to give free rotational passage to the output shaft 5 of the motor (in the example shown, this shaft extends beyond the rigid support plate 10, but it may have any other desired arrangement, and particularly extend opposite from the surface 4 or extend parallel with the plate 10).

In FIG. 2 is shown a second embodiment of mounting the motor 1 to a printed circuit board 14 of conventional type. The motor 1 is here arranged, as in the majority of cases, on the free side of the plate 14, that is to say on the side of its surface devoid of printed circuits. The pins 7 are engaged through holes 15 pierced in correspondence and opening, on the opposite face, at the center of the conducting spots 16 belonging to the printed circuits on this face. The mechanical fastening of the motor 1 to the plate 14, as well as the establishment of the electrical continuity between the pins 7 and the corresponding conducting spots 16, is obtained by welds 17. If necessary, if the welds 17 have insufficient mechanical strength, it is possible to reinforce them by resorting to an additional mechanical fastening (not shown) which may be, for example, effected by screwing, stapling, etc.

Due to its arrangement, the motor 1 may be mounted on a plate with conducting circuits in two different ways: with electrical continuity obtained by simple pressure or by welding to the surface of the plate bearing the printed circuits or to the opposite surface, which increases its field of use very advantageously without excessive complication of its structure resulting therefrom in any way.

As is self-evident and as emerges already from the foregoing, the invention is in no way limited to these types of application and embodiments; it encompasses thereof, on the contrary, all modifications.

I claim:

1. Electrical component equipped for electrical connection with a printed circuit board, said component being provided with two alternative sets of contacts, each set having at least two separate contacts, the contacts of one set being mechanically different from the contents of the other set, with each respective contact of one set being interconnected electrically with a respective contact of the other set, one of these sets of contacts being constituted by contacts adapted to ensure electrical connections by simple elastic mechanical pressure directly on respectively situated facing conducting spots of the circuit board, mechanical fastening means being in addition provided to fix the electrical component mechanically to the printed circuit board associated with said conducting spots, the other of these sets of contacts being differently constituted by contacts extending from said component and adapted to be mechanically secured to respective conducting spots of the circuit board, due to which the component is selectively mounted on the printed circuit board, either on a side of the printed circuit board having printed circuits with the contacts of the one set of contacts cooperating then by elastic pressure with the conducting spots of the printed circuits, or on the opposite side of the circuit board with the contacts of the other set of contacts passing through the printed circuit board and being fastened to the conducting spots on the side of the printed circuit board having the printed circuits.

2. Electrical component according to claim 1, wherein the two sets of contacts are arranged respectively on opposite faces of the component.

3. Electrical component according to claim 1, wherein the contacts of the first set of contacts are constituted by elastically deformable metal strips.

4. Electrical component according to claim 1, wherein the contacts of the second set of contacts are constituted by pins.

5. Electrical component according to claim 1, said component being provided with a substantially rigid casing and wherein the sets of contacts are supported by this casing.

* * * * *